United States Patent
Takahashi et al.

(10) Patent No.: US 12,387,936 B2
(45) Date of Patent: Aug. 12, 2025

(54) PLASMA PROCESSING METHOD AND PLASMA PROCESSING SYSTEM

(71) Applicant: Tokyo Electron Limited, Tokyo (JP)

(72) Inventors: Kae Takahashi, Miyagi (JP); Maju Tomura, Miyagi (JP); Yoshihide Kihara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 265 days.

(21) Appl. No.: 17/970,609

(22) Filed: Oct. 21, 2022

(65) Prior Publication Data

US 2023/0127467 A1 Apr. 27, 2023

(30) Foreign Application Priority Data

Oct. 22, 2021 (JP) .................. 2021-173405

(51) Int. Cl.
*H01L 21/3065* (2006.01)
*H01L 21/311* (2006.01)
*H01J 37/32* (2006.01)

(52) U.S. Cl.
CPC .... *H01L 21/3065* (2013.01); *H01L 21/31116* (2013.01); *H01L 21/31144* (2013.01); *H01J 37/32165* (2013.01)

(58) Field of Classification Search
CPC ........... H01L 21/3065; H01L 21/31116; H01L 21/31144; H01L 21/6831; H01L 21/67248; H01L 21/67109; H01L 21/67069; H01J 37/32165; H01J 37/32091; H01J 37/32174
See application file for complete search history.

(56) References Cited

U.S. PATENT DOCUMENTS

| | | | | |
|---|---|---|---|---|
| 11,101,138 | B2 * | 8/2021 | Tomura | H01L 21/68757 |
| 11,804,379 | B2 * | 10/2023 | Gohira | H01J 37/32165 |
| 2013/0029494 | A1 * | 1/2013 | Sasaki | H01J 37/32238 |
| | | | | 438/724 |
| 2013/0164911 | A1 * | 6/2013 | Ito | H01L 21/30655 |
| | | | | 257/E21.546 |
| 2016/0293440 | A1 * | 10/2016 | Nagatomo | H01L 21/308 |
| 2021/0159089 | A1 * | 5/2021 | Suda | H01L 21/32137 |

FOREIGN PATENT DOCUMENTS

| | | |
|---|---|---|
| JP | 2016-021546 A | 2/2016 |
| JP | 2021-090039 A | 6/2021 |
| WO | 2020/090451 A | 5/2020 |

* cited by examiner

*Primary Examiner* — Anita K Alanko
(74) *Attorney, Agent, or Firm* — XSENSUS LLP (57) ABSTRACT

A plasma processing method includes: (a) providing a substrate having an etching target film including a silicon oxide film and a silicon nitride film, and a mask film defining an opening over the etching target film, on a substrate support in a chamber of a plasma processing apparatus; (b) generating a first plasma from a first processing gas including HF gas, $C_xF_y$ gas (x and y are integers of 1 or more) or $C_sH_tF_u$ gas (s, t, and u are integers of 1 or more), and an oxygen-containing gas to etch the silicon nitride film; and (c) generating a second plasma from a second processing gas including HF gas, $C_vF_w$ gas (v and w are integers of 1 or more), and an oxygen-containing gas to etch the silicon oxide film. In (b) and (c), a temperature of the substrate support is set to 0° C. or lower.

21 Claims, 8 Drawing Sheets

PLASMA PROCESSING METHOD AND PLASMA PROCESSING SYSTEM

CROSS-REFERENCE TO RELATED APPLICATION

This application is based on and claims priority from Japanese Patent Application No. 2021-173405 filed on Oct. 22, 2021 with the Japan Patent Office, the disclosure of which is incorporated herein in its entirety by reference.

TECHNICAL FIELD

The present disclosure relates to a plasma processing method and a plasma processing system.

BACKGROUND

Japanese Patent Laid-Open Publication No. 2016-021546 discloses a method of etching a substrate on which a silicon oxide film, a silicon nitride film, and a polysilicon mask are formed.

SUMMARY

An embodiment of the present disclosure provides a plasma processing method performed in a plasma processing apparatus including a chamber, The plasma processing method includes: (a) providing a substrate having an etching target film including a silicon oxide film and a silicon nitride film, and a mask film defining an opening over the etching target film, on a substrate support in the chamber; (b) generating a first plasma from a first processing gas including HF gas, $C_xF_y$ gas (x and y are integers of 1 or more) or $C_sH_tF_u$ gas (s, t, and u are integers of 1 or more), and an oxygen-containing gas to etch the silicon nitride film; and (c) generating a second plasma from a second processing gas including HF gas, $C_vF_w$ gas (v and w are integers of 1 or more), and an oxygen-containing gas to etch the silicon oxide film. In (b) and (c), a temperature of the substrate support is set to 0° C. or lower.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, each of the embodiments of the present disclosure will be described.

An embodiment of the present disclosure provides a plasma processing method performed in a plasma processing apparatus including a chamber. The plasma. processing method includes: (a) providing a substrate having an etching target film including a silicon oxide film and a silicon nitride film, and a mask film defining an opening over the etching target film, on a substrate support in the chamber; (b) generating a first plasma from a first processing gas including HF gas, $C_xF_y$ gas (x and y are integers of 1 or more) or $CH_sH_tF_u$ gas (s, t, and u are integers of 1 or more), and an oxygen-containing gas to etch the silicon nitride film; and (c) generating the plasma from a second processing gas including HF gas, $C_vF_w$ gas (v and w are integers of 1 or more), and an oxygen-containing gas to etch the silicon oxide film. In (b) and (c), a temperature of the substrate support is set to 0° C. or lower.

According to the embodiment of the present disclosure, the first processing gas includes a different type of gas from the second processing gas.

According to the embodiment of the present disclosure, the first processing gas includes the $C_sH_tF_u$ gas.

According to the embodiment of the present disclosure, the first processing gas includes the $C_xF_y$ gas, and the $C_xF_y$ gas is different from the $C_vF_w$ gas included in the second processing gas.

According to the embodiment of the present disclosure, in (b), the temperature of the substrate support is set to a first temperature, and in (c), the temperature of the substrate support is set to a second temperature lower than the first temperature.

According to the embodiment of the present disclosure, in (b), a bias signal having a first output is supplied to the substrate support, and in (c), a bias signal having a second output smaller than the first output is supplied to the substrate support, or no bias signal is supplied to the substrate support.

According to the embodiment of the present disclosure, in (b), a pulse wave of a bias signal having a first duty ratio is supplied to the substrate support, and in (c), a. pulse wave of a bias signal having a second duly ratio smaller than the first duty ratio is supplied to the substrate support.

According to the embodiment of the present disclosure, the bias signal is a bias DC signal.

According to the embodiment of the present disclosure, in (b), a bias RF signal having a first frequency is supplied to the substrate support, and in (c), a bias RF signal having a second frequency lower than the first frequency is supplied to the substrate support.

According to the embodiment of the present disclosure, in (b), a first heat transfer gas having a first pressure is supplied between the substrate and the substrate support, and in (c), a second heat transfer gas having a second pressure lower than the first pressure is supplied between the substrate and the substrate support.

According to the embodiment of the present disclosure, in (b), a temperature of a heat transfer fluid supplied to the substrate support is set to a third temperature, and in (c), the temperature of the heat transfer fluid supplied to the substrate support is set to a fourth temperature lower than the third temperature.

According to the embodiment of the present disclosure, the mask film is a polysilicon film, a boron-doped silicon film, a tungsten-containing film, an amorphous carbon film, a tin oxide film, or a titanium-containing film.

According to the embodiment of the present disclosure, the mask film has an opening width of 50 nm or less.

According to the embodiment of the present disclosure, the $C_xF_y$ gas or the $C_vF_w$ gas includes at least one selected from the group consisting of $C_2F_2$ gas, $C_2F_4$ gas, $C_3F_6$ gas, $C_3F_8$ gas, $C_4F_6$ gas, $C_4F_8$ gas, and $C_5F_8$ gas.

According to the embodiment of the present disclosure, the $C_sH_tF_u$ gas includes at least one selected from the group consisting of $CHF_3$ gas, $C_2F_2$ gas, $CH_3F$ gas, $C_2HF_5$ gas, $C_2H_2F_4$ gas, $C_2H_3F_3$ gas, $C_2H_4F_2$ gas, $C_3HF_7$ gas, $C_3H_2F_2$ gas, $C_3H_2F_4$ gas, $C_3H_2F_6$ gas, $C_3H_3F_5$ gas, $C_4H_2F_6$ gas, $C_4H_5F_5$ gas, $C_4H_4F_2F_8$ gas, $C_5H_2F_6$ gas, $C_5H_2F_{10}$ gas, and $C_5H_3F_7$ gas.

According to the embodiment of the present disclosure, the first processing gas and the second processing gas have a highest flow rate of HF gas.

According to the of embodiment of the present disclosure, at least one of the first processing gas and the second processing gas further includes a phosphorous-containing gas.

According to the embodiment of the present disclosure, at least one of the first processing gas and the second processing gas further includes $WF_6$ gas.

According to the embodiment of the present disclosure, in (b) and (c), the temperature of the substrate support is set to −50° C. or lower.

An embodiment of the present disclosure provides a plasma processing method performed in a plasma processing apparatus including a chamber. The plasma processing method includes: (a) providing a substrate having an etching target film including a silicon oxide film and a silicon nitride film, and a mask film defining an opening over the etching target film, on a substrate support in the chamber; (b) generating a first plasma from a first processing gas to etch the silicon nitride film with HF species, $C_xF_y$ species (x and y are integers of 1 or more) or $C_sH_tF_u$ species (s, t, and u are integers of 1 or more), and oxygen active species included in the first plasma; and (c) generating a second plasma from a second processing gas to etch the silicon oxide film with HF species, $C_vF_w$ species (v and w are integers of 1 or more), and oxygen active species included in the second plasma. In (b) and (c), a temperature of the substrate support is set to 0° C. or lower.

According to the embodiment of the present disclosure, the HF species is generated from at least one selected from the group consisting of $CH_2F_2$ gas, $C_3H_2F_4$ gas, and $C_4H_2F_6$ gas.

An embodiment of the present disclosure provides a plasma processing system that includes: a chamber; a substrate support provided in the chamber; a plasma generation unit; and a control unit. The control unit is configured to cause: (a) providing a substrate having an etching target film including a silicon oxide film and a silicon nitride film, and a mask film defining an opening over the etching target film on a substrate support in a chamber; (b) generating a first plasma from a first processing gas including HF gas, $C_xF_y$ gas (x and y are integers of 1 or more) or $C_sH_tF_u$ gas (s, t, and u are integers of 1 or more), and an oxygen-containing gas using power supplied from the plasma generation unit to etch the silicon nitride film; and (c) generating a second plasma from a second processing gas including HF gas, $C_vF_w$ gas (v and w are integers of 1 or more), and an oxygen-containing gas using power supplied from the plasma generation unit to etch the silicon oxide film. In (b) and (c), a temperature of the substrate support is set to 0° C. or lower.

Hereinafter, embodiments of the present disclosure will be described in detail with reference to the accompanying drawings. In each drawing, the same or similar elements are denoted by the same reference numerals, and overlapping descriptions are omitted. Unless otherwise specified, positional relationships such as top, bottom, left, and right will be described based on the positional relationships illustrated in the drawings. The dimensional ratios in the drawings do not indicate the actual ratios, and the actual ratios are not limited to the illustrated ratios.

<Configuration Example of Plasma Processing System>

Figure 1:
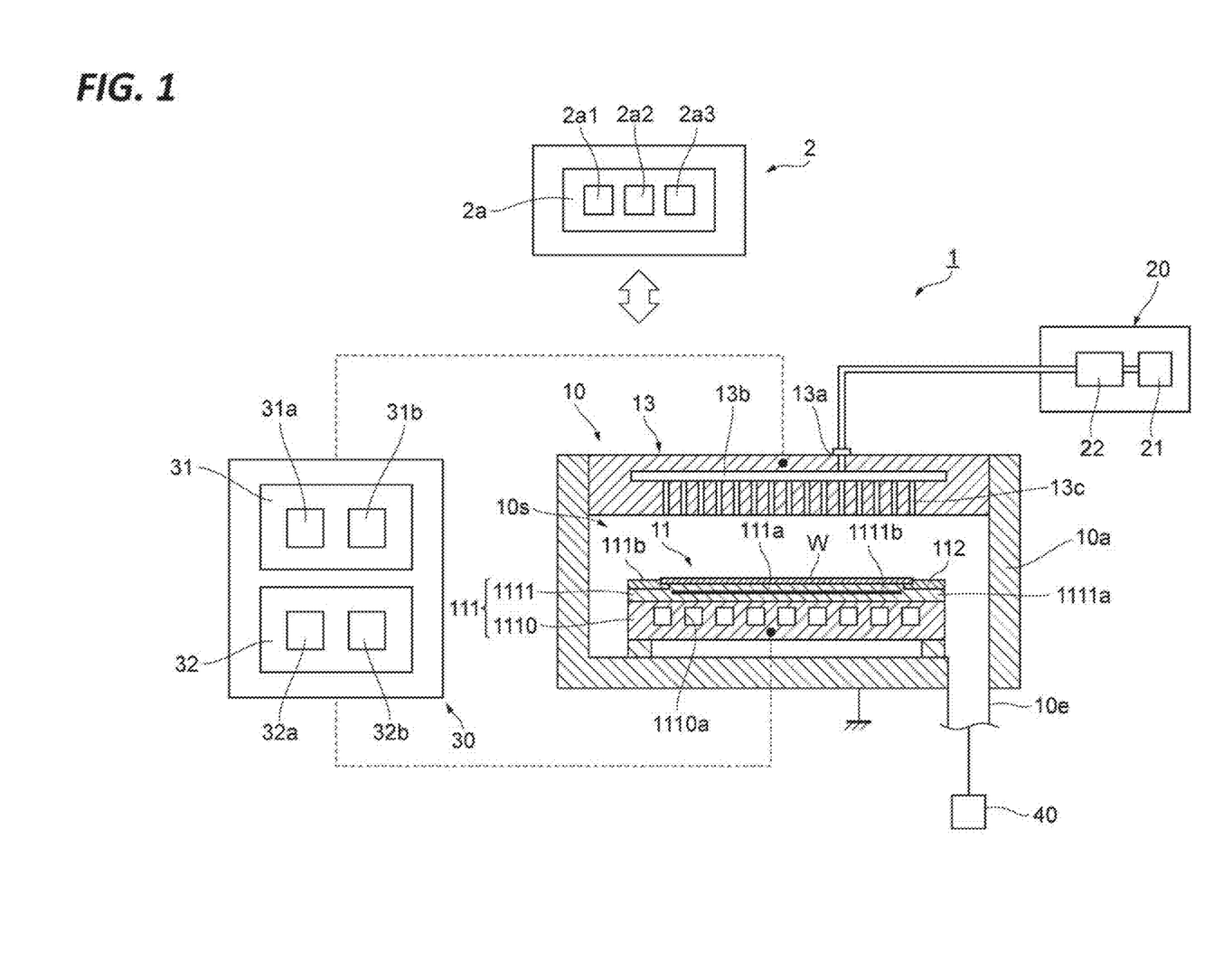
FIG. 1 is a view schematically illustrating a plasma processing system.

A configuration example of a plasma processing system will be described below. FIG. 1 is a view illustrating a configuration example of a capacitively coupled plasma processing apparatus.

The plasma processing system includes a capacitively coupled plasma processing apparatus 1 and a control unit 2. The capacitively coupled plasma processing apparatus 1 includes a plasma processing chamber 10, a gas supply unit 20, a power supply 30, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In an embodiment, the shower head 13 constitutes at least a part of the ceiling of the plasma processing chamber 10. The plasma processing chamber 10 includes a plasma processing space 10s defined by a shower head 13, a side wall 10a of the plasma processing chamber 10, and a substrate support 11. The plasma processing chamber 10 includes at least one gas supply port for supplying at least one processing gas to the plasma processing space, and at least one gas discharge port for discharging gas from. the plasma processing space. The plasma processing chamber 10 is grounded. The shower head 13 and the substrate support 11 are electrically insulated from the housing of the plasma processing chamber 10.

The substrate support 11 includes a main body 11 and a ring assembly 112. The main body 111 includes a central region 111a for supporting the substrate (wafer) W and an annular region 111b for supporting the ring assembly 112. The wafer is an example of the substrate W. The annular region 111b of the main body 111 surrounds the central region 111a of the main body 111 in a plan view. The substrate W is disposed on the central region 111a of the main body 111, and the ring assembly 112 is disposed on the annular region 111b of the main body 111 to surround the substrate W on the central region 111a of the main body 111. Therefore, the central region 111a is also referred to as a substrate support surface for supporting the substrate W, and the annular region 111b is also referred to as a ring support surface for supporting the edge ring assembly 112.

In an embodiment, the main body 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111a and an electrostatic electrode 1111b disposed in the ceramic member 1111a. The ceramic member 1111a includes a central region 111a. In an embodiment, the ceramic member 1111a also includes an annular region 111b. Other members surrounding the electrostatic chuck 1111, such as an annular electrostatic chuck or an annular insulating member, may have the annular region 111b. In this case, the ring assembly 112 may be disposed on the annular electrostatic chuck or the annular insulating member or may be disposed on both the electrostatic chuck 1111 and the annular insulating member. An RF or DC electrode may also be disposed in the ceramic member 1111a, in which case the RF or DC electrode functions as a lower electrode. When a bias RF signal or DC signal (to be described below) is connected to the RF or DC electrode, the RF or DC electrode is also referred to as a bias electrode. Further, both the conductive member of the base 1110 and the RF or DC electrode may function as two lower electrodes.

The ring assembly 112 includes one or more annular members. In an embodiment, one or more annular members include one or more edge rings and at least one cover ring. The edge ring is made of a conductive material or an insulating material, and the cover ring is made of an insulating material.

Further, the substrate support 11 may include a temperature control module configured to control at least one of the electrostatic chuck 1111, the ring assembly 112, and the substrate to a target temperature. The temperature control module may include a heater, a heat transfer medium, a flow path 1110a, or a combination thereof. A heat transfer fluid, such as brine or gas, flows through the flow path 1110a. In an embodiment, the flow path 1110a is formed in the base 1110, and one or more heaters are disposed in the ceramic member 1111a of the electrostatic chuck 1111. Further, the substrate support 11 may include a heat transfer gas supply unit configured to supply a heat transfer gas between the back surface of the substrate W and the central region 111a.

The shower head 13 is configured to introduce at least one processing gas from the gas supply unit 20 into the plasma processing space 10s. The shower head 13 includes at least one gas supply port 13a, at least one gas diffusion chamber 13b, and a plurality of gas introduction ports 13c. The processing gas supplied to the gas supply port 13a passes through the gas diffusion chamber 13b and is introduced from the plurality of gas introduction ports 13c into the plasma processing space 10s. The shower head 13 also includes an upper electrode. In addition to the shower head 13, the gas introduction unit may include one or more side gas injectors (SG1) attached to one or more openings formed in the side wall 10a.

The gas supply unit 20 may include at least one gas source 21 and at least one flow rate controller 22. In an embodiment, the gas supply unit 20 is configured to supply at least one processing gas from the corresponding gas source 21 to the shower head 13 via the corresponding flow rate controller 22. Each flow rate controller 22 may include, for example, a mass flow controller or a pressure-controlled flow rate controller. Further, the gas supply unit 20 may include one or more flow rate modulation devices that modulate or pulse the flow rate of al least one processing gas.

The power supply 30 includes an RF power supply 31 coupled to the plasma processing chamber 10 via at least one impedance matching circuit. The RF power supply 31 is configured to supply at least one RF signal (RF power), such as a source RF signal and a bias RF signal, to at least one lower electrode and/or al least one upper electrode. As a result, plasma is generated from one or more processing gases supplied to the plasma processing space 10s. Therefore, the RF power supply 31 may function as at least a part of a plasma generation unit configured to generate plasma from one or more processing gases in the plasma processing chamber 10. Further, by supplying the bias RF signal to at least one lower electrode, a bias potential is generated in the substrate W, and the ionic component in the formed plasma may be drawn into the substrate W.

In an embodiment, the RF power supply includes a first RF generation unit 31a and a second RF generation unit 31b. The first RF generation unit 31a is configured to be coupled to at least one lower electrode and/or at least one upper electrode via at least one impedance matching circuit and generate a source RF signal (source RF power) for plasma generation. In an embodiment, the source RF signal has frequencies in the range of 10 MHz to 150 MHz. In an embodiment, the first RF generation unit 31a may be configured to generate multiple source RF signals having different frequencies. One or more source RF signals generated are provided to at least one lower electrode and/or at least one upper electrode.

The second RF generation unit 31b is configured to be coupled to at least one lower electrode via at least one impedance matching circuit and generate a bias RF signal (bias RF power). The frequency of the bias RF signal may be the same as or different from the frequency of the source RF signal. In an embodiment, the bias RF signal has a lower frequency than that of the source RF signal. In an embodiment, the bias RF signal has frequencies in the range of 100 kHz to 60 MHz. In an embodiment, the second RF generation unit 31a may be configured to generate multiple source RF signals having different frequencies. One or more source RF signals generated are provided to at least one lower electrode. In various embodiments, at least one RF signal among the source RF signal and the bias RF signal may be pulsed.

Further, the power supply 30 may include a DC power supply 32 coupled to the plasma processing chamber 10. The RF power supply includes a first DC generation unit 32a and a second DC generation unit 32b. In an embodiment, the first DC generation unit 32a is configured to be connected to at least one lower electrode and generate a first DC signal. The generated first bias DC signal is applied to at least one lower electrode. In an embodiment, the second DC generation unit 32b is configured to be connected to at least one upper electrode and generate a second DC signal. The generated second bias DC signal is applied to at least one upper electrode.

In various embodiments, at least one of the first and second DC signals may be pulsed. In this case, sequences of DC-based voltage pulses are applied to at least one lower electrode and/or at least one upper electrode. The voltage pulses may have a pulse waveform in a rectangular shape, a trapezoidal shape, a triangular shape, or in a combination thereof In an embodiment, a waveform generation unit for generating sequences of voltage pulses from a DC signal is connected between the first DC generation unit 32a and at least one lower electrode. Therefore, the first DC generation pit 32a and the waveform generation unit constitute a voltage pulse generation unit. When the second DC generation unit 32b and the waveform generation unit constitute a voltage pulse generation unit, the voltage pulse generation unit is connected to at least one upper electrode. The voltage pulse may have a positive polarity or a negative polarity. Further, the sequence of voltage pulses may include one or more positive voltage pulses and one or more negative voltage pulses in one cycle. The first and second DC generation units 32a and 32b may be provided in addition to the RF power supply 31, or the first DC generation unit 32a may be provided instead of the second RF generation unit 31b.

The exhaust system 40 may be connected to, for example, a gas discharge port 10e provided at the bottom of the plasma processing chamber 10. The exhaust system 40 may include a pressure regulating valve and a vacuum pump. The pressure regulating valve adjusts the pressure in the plasma processing space 10s. The vacuum pump may include a turbo molecular pump, a dry pump, or a combination thereof.

The control unit 2 processes computer-executable instructions that cause the plasma processing apparatus 1 to perform various steps described in the present disclosure. The control unit 2 may be configured to control each element of the plasma processing apparatus 1 to perform the various steps described herein. In an embodiment, a part of or all elements of the control unit 2 may be included in the plasma processing apparatus 1. The control unit 2 may include, for example, a computer 2a. The computer 2a may include, for example, a processing unit (central processing unit (CPU)) 2a1, a storage unit 2a2, and a communication interface 2a3. The processing unit 2a1 may be configured to perform various control operations by reading a program from the storage unit 2a2 and executing the read program. The program may be stored in the storage unit 2a2 in advance, or may be acquired via a medium when necessary. The acquired program is stored in the storage unit 2a2, read from the storage unit 2a2, and executed by the processing unit 2a1. The medium may be various storage media readable by the computer 2a. or may be a communication line connected to the communication interface 2a3. The storage unit 2a2 may include a random access memory (RAM), a read only memory (ROM), a hard disk drive (HDD), a solid state drive (SSD), or a combination thereof The communication interface 2a3 may communicate with the plasma processing apparatus 1 via a communication line such as a local area network (LAN).

Example of Plasma Processing Method

Figure 2:
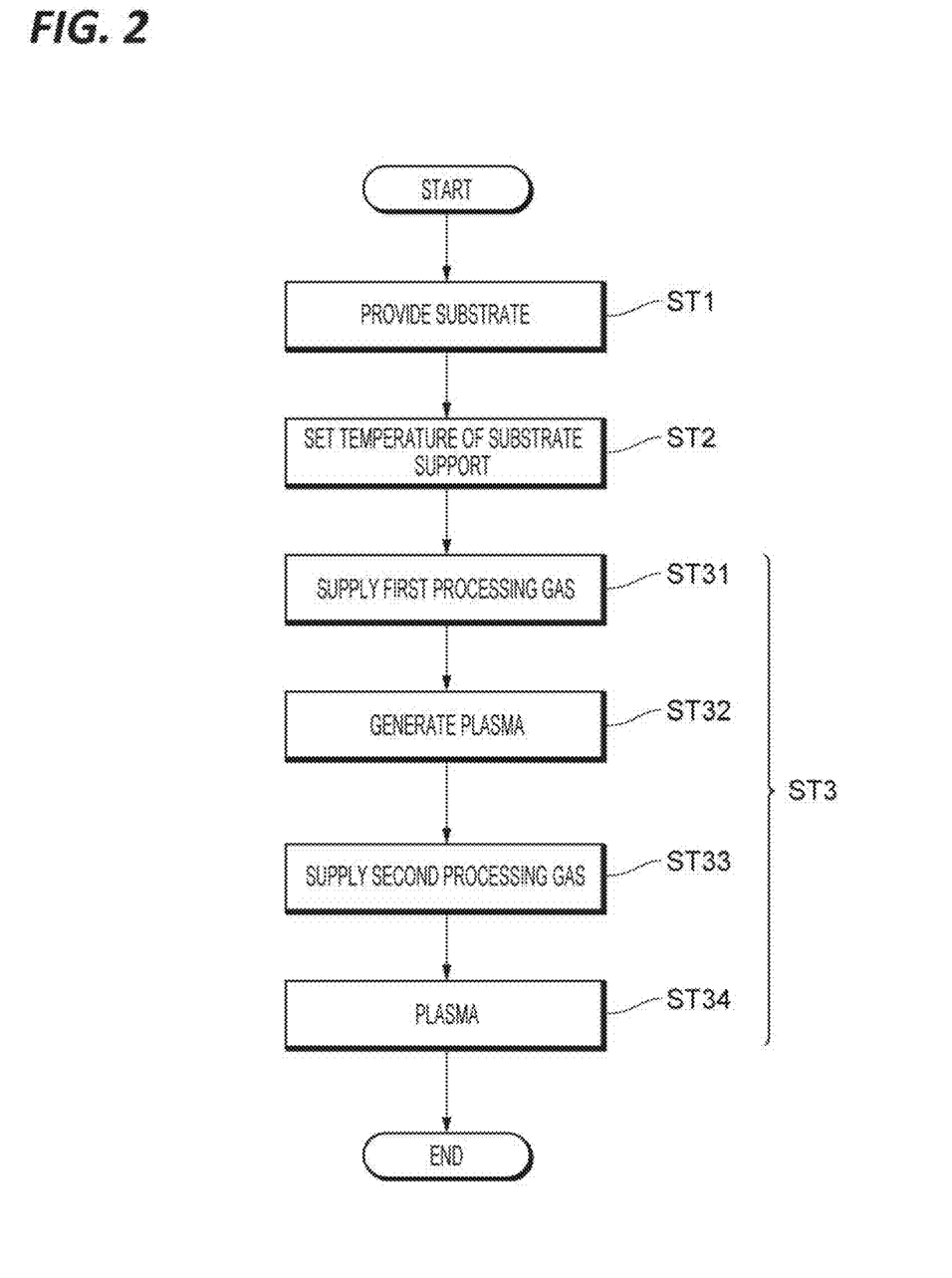
FIG. 2 is a flow chart illustrating an example of the present processing method.

FIG. 2 is a flow chart illustrating a plasma processing method (hereinafter, also referred to as a "present processing method") according to the embodiment. As illustrated in FIG. 2, the present processing method includes step ST1 of providing a substrate, step ST2 of setting the temperature of the substrate support, and step ST3 of etching an etching target film on the substrate. The processing in each step may be performed in the plasma processing system illustrated in FIG. 1. Descriptions will be made below on an example in which the control unit 2 controls each unit of the plasma processing apparatus 1 to perform the present processing method on the substrate W.

Step ST1: Providing Substrate

In step ST1, the substrate W is provided within the plasma processing space 10s of the plasma processing apparatus 1. The substrate W is disposed on the upper surface of the substrate support 11 to face the upper electrode, and is held on the substrate support 11 by the electrostatic chuck 1111.

Figure 3:
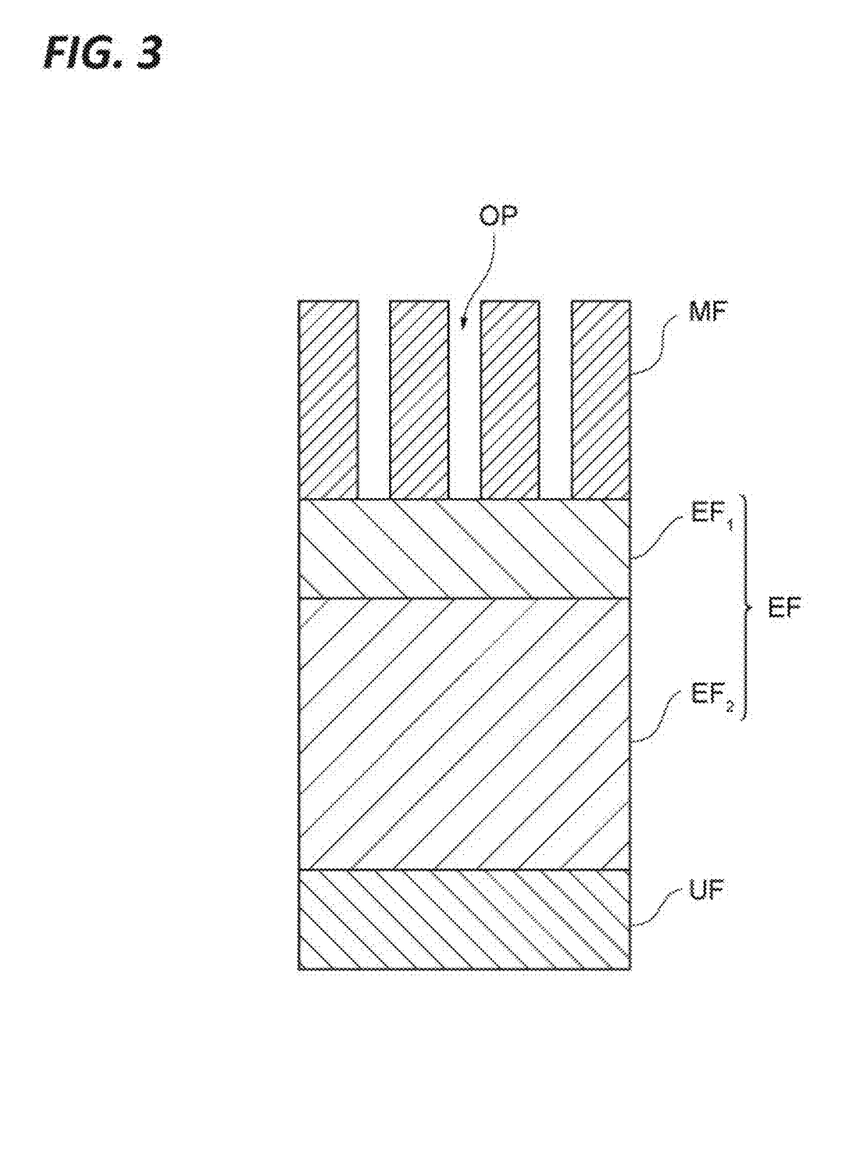
FIG. 3 is a view illustrating an example of a cross-sectional structure of a substrate W.

FIG. 3 is a view illustrating an example of a cross-sectional structure of the substrate W provided in step ST1. In the substrate W, an etching target film EF and a mask film MF are formed in this order on an underlying film UF. The substrate W may be, for example, a substrate for manufacturing a DRAM.

The underlying film UF may be, for example, a silicon water or an organic film, a dielectric film, a metal film, or a semiconductor film formed on the silicon wafer. The underlying film OF may be configured by laminating a plurality of films.

The etching target film EF may include, for example, a silicon oxide film ($SiO_x$ film) $EF_2$ and a silicon nitride film $EF_1$ formed on the silicon oxide film $EF_2$. The etching target film EF is a laminated film including a film to be etched by the present processing method.

The underlying film UF and/or the etching target film EF may be formed by a CVD method or a spin coating method. The underlying film UF and/or the etching target film ET may be a flat film or a film having unevenness.

The mask film MF is formed on the etching target film EF. The mask film MF defines at least one opening OP on the etching target film EF. The opening OP is a space above the etching target film EF and is surrounded by the sidewalls of the mask film MF. That is, in FIG. 3, the upper surface of the etching target film EF includes a region covered with the mask film MF and a region exposed at the bottom of the opening OP.

The opening OP may have any shape when the substrate W is viewed from above, that is, when the substrate W is viewed from the top to the bottom in FIG. 3. The shape may be, for example, a circle, an ellipse, a rectangle, a line, or a combination of one or more of these shapes. The mask film MF may have a plurality of sidewalls, and the plurality of sidewalls may define the plurality of openings OP. The plurality of openings OP may each have a linear shape and may be disposed at regular intervals to form a line and space pattern. Further, the plurality of openings OP may each have a hole shape and form an array pattern, The opening width of the opening OP may be 50 nm or less. The opening width may be 30 nm or less. The opening width may be 15 nm or more and 25 nm or less.

The mask film MF may be, for example, a polysilicon film, a boron-doped silicon film, a tungsten-containing film (e.g., a WC film, a WSi film, etc), an amorphous carbon film, a tin oxide film, or a titanium-containing film (e.g., a TiN film, etc.). The mask film ME may be a single layer mask consisting of one layer or a multilayer mask consisting of two or more layers. The mask film MF may be formed by a CVD or spin coating. The mask film MF may be formed by lithography. The opening OP may be formed by etching the mask film MF.

At least a part of the process of forming each component of the substrate W may be performed in the plasma processing chamber 10. In an example, a step of etching the mask film MF to form the opening OP may be performed in the plasma processing chamber 10. That is, the etching of the opening OP and the etching target film EF (to be described later) may be performed continuously in the same chamber. Further, after all or part of each component of the substrate W is formed in a device or a chamber outside the plasma processing apparatus 1, the substrate W may be loaded into the plasma processing space 10s of the plasma processing apparatus 1 and disposed on the upper surface of the substrate support 11.

Step ST2: Setting Temperature of Substrate Support in step ST2, the temperature of the substrate support 11 is set to a target temperature of 0° C. or lower. The target temperature may be −10° C. or lower, −20° C. or lower, −30° C. or lower, −40° C. or lower, −50° C. or lower, −60° C. or lower, or −70° C. or lower.

Setting the temperature of the substrate support 11 to the target temperature includes measuring the temperature of the substrate support 11 to adjust the temperature of the substrate support 11 by the temperature control module such that the temperature of the substrate support 11 reaches the target temperature, but is not limited thereto. In an example, setting the temperature of the substrate support 11 to the target temperature includes (a) setting the temperature of the substrate W or the temperature of the heat transfer fluid flowing through the flow path 1110a to the target temperature or a temperature different from the target temperature such that the temperature of the substrate support 11 reaches the target temperature, and (b) setting the temperature of the substrate support 11 or the heat transfer fluid flowing through the flow path 1110a to the target temperature or a temperature different from the target temperature such that the temperature of the substrate W reaches the target temperature. "Setting" the temperature includes inputting, selecting, or storing the temperature in the control unit 2.

In the present processing method, step ST2 may be performed before step ST1. That is, the substrate W may be provided to the substrate support 11 after setting the temperature of the substrate support 11 to the target temperature.

Step ST3: Etching Etching Target Film EF

In step ST3, the etching target film EF is etched. Step ST3 includes step ST31 of supplying a first processing gas, step ST32 of generating plasma from the first processing gas, step ST33 of supplying a second processing gas, and step ST34 of generating plasma from the second processing gas. During the process in step ST3, the temperature of the substrate support 11 is set to the target temperature of 0° C. or lower that is set in step ST2. In an embodiment, the pressure in the plasma processing space 10s may be set at 30 mT (4.0 Pa) or less.

In step ST31, the first processing gas is supplied into the plasma processing space 10s. The first processing gas includes HF gas, $C_xF_y$ gas (x and y are integers of 1 or more) or $C_sH_tF_u$ gas (s, t, and u are integers of 1 or more), and an oxygen-containing gas.

In the first processing gas, the HF gas may have the highest flow rate. In an example, the flow rate of the HF gas may be 70% by volume or more, or 80% by volume or more, of the total flow rate of the first processing gas. The gas capable of generating HF species in the chamber may be used in place of or in conjunction with HF gas in the first processing gas. The HF species includes at least one of gas, radicals, and ions of hydrogen fluoride. For example, at least one selected from the group consisting of $CH_2F_2$ gas, $C_3H_2F_4$ gas, $C_3H_2F_6$ gas, $C_3H_3F_5$ gas, $C_4H_2F_6$ gas, $C_4H_5F_5$ gas, $C_4H_2F_8$ gas, $C_5H_2F_6$ gas, $C_5H_2F_{10}$ gas, and $C_5H_3F_7$ gas may be used as the gas capable of generating HF species. In an example, at least one selected from the group consisting of $CH_2F_2$ gas, $C_3H_2F_4$ gas, and $C_4H_2F_6$ gas is used as the gas capable of generating HF species.

The $C_vF_w$ may include at least one selected from the group consisting of $C_2F_2$ gas, $C_2F_4$ gas, $C_3F_6$ gas, $C_3F_8$ gas, $C_4F_6$ gas, $C_4F_8$ gas, and $C_5F_8$ gas.

The gas may include at least one selected from the group consisting of $CHF_3$ gas, $CH_2F_2$ gas, $CH_3F$ gas, $C_2HF_5$ gas, $C_2H_2F_4$ gas, $C_2H_3$ gas, $C_2H_4F_2$ gas, $C_3HF_7$ gas, $C_3H_2F_2$ gas, $C_3H_2F_4$ gas, $C_3H_2F_6$ gas, $C_3H_3F_5$ gas, $C_4H_2F_6$ gas, $C_4H_5F_5$ gas, $C_4H_2F_8$ gas, $C_5H_2F_6$ gas, $C_5H_2F_{10}$ gas, and $C_5H_3F_7$ gas. Further, the first processing gas may contain both the $C_xF_y$ gas and the $C_sH_tF_u$ gas.

For example, at least one gas selected from the group consisting of $O_2$, $CO$, $CO_2$, $H_2O$, and $H_2O_2$ may be used as the oxygen-containing gas. In an example, the processing gas may include an oxygen-containing gas other than $H_2O$, that is, at least one gas selected from the group consisting of $O_2$, $CO$, $CO_2$, and $H_2O_2$. The flow rate of the oxygen-containing gas may be adjusted according to the flow rates of the $C_xF_y$ gas and the $C_sH_tF_u$ gas.

In step ST32, a source RF signal (RF power) is supplied from the first RF generation unit 31a to the lower electrode and/or the upper electrode. Thus, plasma is generated from the first processing gas. As a bias signal (power), a bias RF signal is supplied from the second RF generation unit 31b to the lower electrode to generate a bias potential in the substrate. As a result, active species such as ions and radicals in the generated plasma are attracted to the substrate W, and the silicon nitride film $EF_1$ is etched in the depth direction through the opening OP of the mask film MF. As described above, the temperature of the substrate support 11 is set to a target temperature of 0° C. or lower during etching.

The timing to start supplying the bias signal may be the same as or different from the timing to start supplying the source RF signal. Further, a bias DC signal may be used as the bias signal (power). That is, a bias potential may be generated on substrate W by supplying a negative bias DC signal from the DC generation unit 32a to the lower electrode. The source RF signal and the bias signal may both be continuous waves, or one may be a continuous wave and the other may be a pulse wave.

Figure 4:
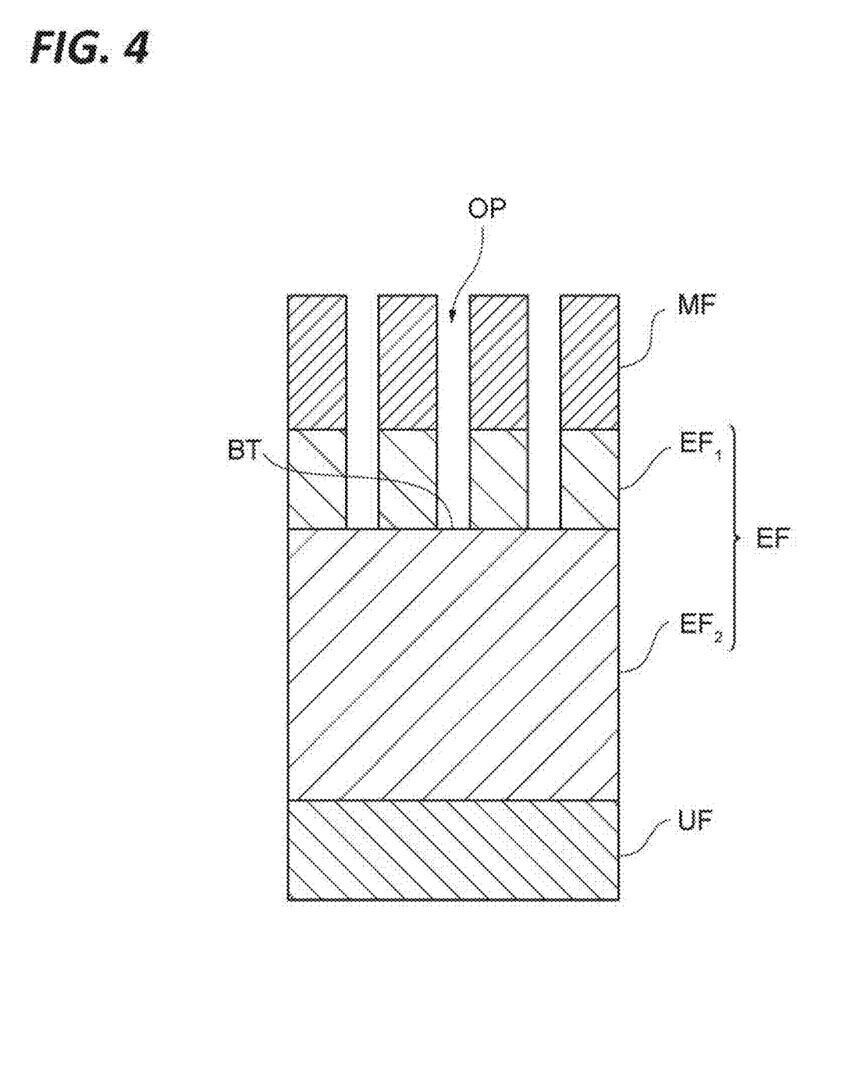
FIG. 4 is a view illustrating an example of a cross-sectional structure of the substrate W after step ST32 is completed.

FIG. 4 is a view illustrating an example of the cross-sectional structure of the substrate W after step ST32 is completed. As illustrated in FIG. 4, when the bottom BT of the recess formed in the silicon nitride film $EF_1$ etching reaches the silicon oxide film $EF_2$ and the surface of the silicon oxide film $EF_2$ is exposed, step ST32 is completed. Step ST32 may be completed after a part of the silicon oxide film $EF_2$ is etched. That is, in step ST32, a part of the silicon oxide film $EF_2$ may be over-etched in the depth direction.

In step ST33, a second processing gas is supplied into the plasma processing space 10s, The second processing gas includes HF gas, $C_vF_w$ gas (where v and w are integers of 1 or more), and an oxygen-containing gas.

In the second processing gas, the HF gas may have the highest flow rate. In an example, the flow rate of the HF gas may be 70% by volume or more, or 80% by volume or more, of the total flow rate of the second processing gas. Similarly to the first processing gas, the second processing gas may be a gas capable of generating HF species in the chamber in place of or in conjunction with the HF gas.

The $C_vF_w$ may include at least one selected from the group consisting of $C_2F_2$ gas, $C_2F_4$ gas, $C_3F_6$ gas, $C_3F_8$ gas, $C_4F_6$ gas, $C_4F_8$ gas, and $C_5F_8$ gas.

For example, at least one gas selected from the group consisting of $O_2$, $CO$, $CO_2$, $H_2O$, and $H_2O_2$ may be used as the oxygen-containing gas. In an example, the processing gas may include an oxygen-containing gas other than $H_2O$, that is, at least one gas selected from the group consisting of $O_2$, $CO$, $CO_2$, $H_2O$, and $H_2O_2$. The flow rate of the oxygen-containing gas may be adjusted according to the flow rate of the $C_vF_w$ gas.

The type of gas included in the second processing gas may be different than the first processing gas. In an example, when the first processing gas includes $C_xF_y$ gas, the $C_xF_w$ gas included in the second processing gas may be a different type of gas than the $C_xF_y$ gas. Also, when the first processing gas includes $C_sH_tF_u$ gas, the second processing gas does not need to include $C_sH_tF_u$ gas.

The type of gas included in the second processing gas may be the same as the type of gas included in the first processing gas. In an example, when the first processing gas includes $C_xF_y$ gas, the gas included in the second processing gas may be the same type of gas as the $C_xF_y$ gas.

The flow rate of the same type of gas commonly included in the first processing gas and the second processing gas may be the same or different. For example, the flow rates of HF gas included in the first processing gas and the second processing gas may be the same or different.

In step ST34, a source RF signal (RF power) is supplied from the first RF generation unit 31a to the lower electrode and/or the upper electrode. Thus, plasma is generated from the second processing gas. As a bias signal (power), a bias RF signal is supplied from the second RF generation unit 31b to the lower electrode to generate a bias potential in the substrate. As a result, active species such as ions and radicals in the generated plasma are attracted to the substrate W, and the silicon oxide film $EF_2$ is etched in the depth direction through the opening OP of the mask film MF. As described above, the temperature of the substrate support 11 is set to a target temperature of 0° C. or lower during etching.

The timing to start supplying the bias signal may be the same as or different from the timing to start supplying the source RF signal. Further, a bias DC signal may be used as the bias signal (power). That is, a bias potential may be generated on the substrate W by supplying a negative bias DC signal from the DC generation unit 32a to the lower electrode. The source RF signal and the bias signal may both be continuous waves, or one may be a continuous wave and the other may be a pulse wave.

Figure 5:
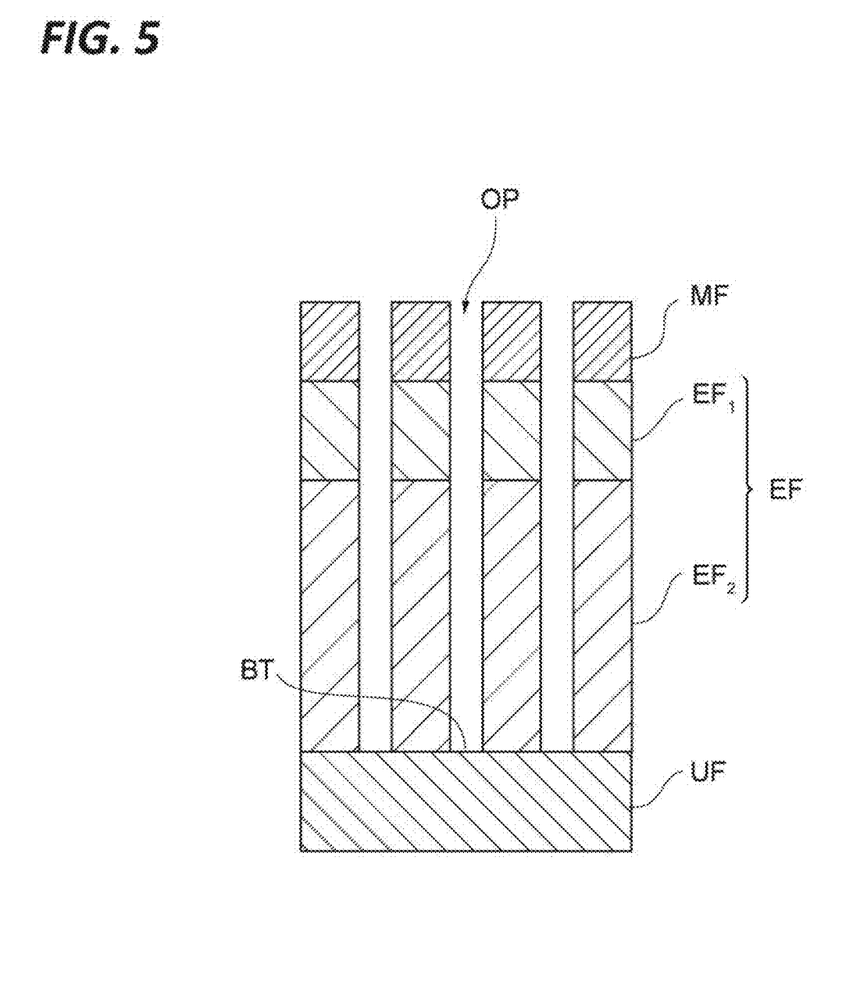
FIG. 5 is a view illustrating an example of a cross-sectional structure of the substrate W after step ST34 is completed.

FIG. 5 is a view illustrating an example of the cross-sectional structure of the substrate W after step ST34 is completed. As illustrated in FIG. 5, when the bottom BT of the recess formed in the silicon nitride film $EF_2$ by etching reaches the underlying film UF and the surface of the underlying film UF is exposed, step ST34 is completed. Step ST34 may be completed after a part of the underlying film UF is etched. That is, in step ST34, a part of the underlying film UF may be over-etched in the depth direction. This completes the present processing method.

In the present processing method, the silicon nitride film $EF_1$ is etched using plasma generated from the first processing gas containing HF gas at a state where the temperature of the substrate support 11 is set to 0° C. or lower (step ST32). Further, the silicon oxide film $EF_2$ is etched using the plasma generated from the second processing gas including the HF gas at a state where the temperature of the substrate support 11 is set to 0° C. or lower (step ST34). Both the adsorption coefficients of HF species in the plasma onto the silicon nitride film $EF_1$ and the silicon oxide film $EF_2$ are higher at a low temperature of 0° C. or lower. Therefore, in steps ST32 and ST34, adsorption of HF species in the plasma onto the silicon nitride film $EF_1$ and the silicon oxide film $EF_2$ may be promoted. As a result, the present processing method may improve the etching rate.

In an embodiment, at least one of the first processing gas and the second processing gas may further include a phosphorus-containing gas. The phosphorus-containing gas may promote the adsorption of HF species in the plasma onto the silicon nitride film $EF_1$ or the silicon oxide film $EF_2$ to improve the etching rate.

A phosphorus-containing gas is a gas that includes phosphorus-containing molecules. The phosphorus-containing molecule may be an oxide such as tetraphosphorus decaoxide ($P_4O_{10}$), tetraphosphorus octaoxide ($P_4O_8$), or tetraphosphorus hexaoxide ($P_4O_6$). Tetraphosphorus decaoxide is sometimes referred to as diphosphorus pentoxide ($P_2O_5$). The phosphorus-containing molecule may be a halide (phosphorus halide) such as phosphorus trifluoride ($PF_3$), phosphorus pentafluoride ($PF_5$), phosphorus trichloride ($PCl_3$), phosphorus pentachloride ($PCl_5$), phosphorus tribromide ($PBr_3$), phosphorus pentabromide ($PBr_5$), and phosphorus iodide ($PI_3$). That is, the phosphorus-containing molecule may include fluorine as a halogen element, such as phosphorus fluoride. Alternatively, the phosphorus-containing molecule may include a halogen element other than fluorine as the halogen element. The phosphorus-containing molecule may be a phosphoryl halide such as phosphoryl fluoride ($POF_3$), phosphoryl chloride ($POCl_3$), or phosphoryl bromide ($POBr_3$). The phosphorus-containing molecule may be phosphine ($PH_3$), calcium phosphide (such as $Ca_3P_2$), phosphoric acid ($H_3PO_4$), sodium phosphate ($Na_3PO_4$), or hexafluorophosphoric acid ($HPF_6$). The phosphorus-containing molecule may be fluorophosphine ($H_gPF_h$). Here, the sum of g and h is 3 or 5. Examples of fluorophosphines include $HPF_2$ and $H_2PF_3$. The processing gas may include, as at least one phosphorus-containing molecule, one or more of the phosphorus-containing molecules described above. For example, the processing gas may include at least one of $PF_3$, $PCl_3$, $PF_5$, $PCl_5$, $POCl_3$, $PH_3$, $PBr_3$, and $PBr_5$ as at least one phosphorus-containing molecule. When each phosphorus-containing molecule included in the processing gas is liquid or solid, each phosphorus-containing molecule may be vaporized by heating and supplied into the plasma processing space 10s.

In an embodiment, at least one of the first processing gas and the second processing gas may further include tungsten hexafluoride ($WF_6$) gas. The $WF_6$ gas may contribute to suppression of bowing in the etching processes of steps ST32 and ST34.

In an embodiment, at least one of the first processing gas and the second processing gas may further include a rare gas such as Ar or Kr.

In an embodiment, the temperature of the substrate support 11 in the etching of the silicon nitride film $EF_1$ (step ST32) may be set to a first temperature. Then, the temperature of the substrate support 11 when etching the silicon oxide film $EF_2$ (step ST34) may be set to a second temperature lower than the first temperature. The adsorption coefficient of HF species onto the silicon nitride film is maximized at higher temperatures than the adsorption coefficient of HF species onto the silicon oxide film. Therefore, by setting the temperature of the substrate support 11 to the first temperature higher than the second temperature in step ST32, the adsorption of the HF species onto the silicon nitride film $EF_1$ may be promoted. In contrast, the adsorption coefficient of HF species onto the silicon oxide film is maximized at lower temperatures than the adsorption coefficient of HF species onto the silicon nitride film. Therefore, by setting the temperature of the substrate support to the second temperature lower than the first temperature in step ST34, the adsorption of the HF species onto the silicon oxide film $EF_2$ may be promoted. As described above, the etching rate of the etching target film EF may be further improved.

In an embodiment, setting the temperature of the substrate support 11 to the first temperature and the second temperature includes adjusting the temperature of the substrate support 11 by changing the amount of heat input to the substrate W and the substrate support 11 by the controls 1 to 5 mentioned below. In an embodiment, one of the controls 1 to 5 is performed. In an embodiment, multiple controls among controls 1 to 5 are performed.

(Control 1) In step ST32, the bias signal having a first output may be supplied to the substrate support 11. Then, in step ST34, a bias signal having a second output that is smaller than the first output may be supplied to the substrate support 11. The bias signal may be a bias RF signal or may be a bias DC signal. The adjustment of the bias signal output may be performed by the second RF generation unit 31b or the bias DC generation unit 32a. Further, the bias signal may be a pulse wave or a continuous wave. The "output" of the bias signal is the effective value of the power of the bias RF signal when the bias signal is a bias RF signal. The "output" of the bias signal is the absolute value of the voltage of the bias DC signal when the bias signal is a bias DC signal (or the effective value of the absolute value of the voltage when the bias DC signal is a pulse wave).

(Control 2) In step ST32, a pulse wave of a bias signal having a first duty ratio may be supplied to the substrate support 11. Then, in step ST34, a pulse wave of a. bias signal having a second duty ratio that is smaller than the first duty ratio may be supplied to the substrate support 11. The bias signal may be a bias RF signal or a bias DC signal. The adjustment of the duty ratio of the bias signal may be performed by the second RF generation unit 31b or the bias DC generation unit 32a. The duty ratio of the bias signal is the percentage of the period of the pulse wave that is occupied by periods of high power or voltage level.

(Control 3) In step ST32, a bias signal having a first frequency may be supplied to the substrate support 11. Then, in step ST34, a bias signal having a second frequency lower than the first frequency may be supplied to the substrate support 11. The bias signal may be a bias RF signal or a bias DC signal. The adjustment of the frequency of the bias signal may be performed by the second RF generation unit 31b or the bias DC generation unit 32a.

(Control 4) In step ST32, the heat transfer gas having the first pressure may be supplied from the heat transfer gas supply unit to a space between the substrate W and the substrate support 11 (i.e., the central region 111a). Then, in step ST34, the heat transfer gas having a second pressure lower than the first pressure may be supplied from the heat transfer gas supply unit to a space between the substrate W and the substrate support 11 (i.e., central region 111a). The adjustment of the supply pressure of the heat transfer gas may be performed by the heat transfer gas supply unit.

(Control 5) In step ST32, the temperature of the heat transfer fluid flowing through the flow path 1110a may be set to a third temperature. Then, in step ST34, the temperature of the heat transfer fluid may be set to a fourth temperature lower than the third temperature. The third temperature may be the same temperature as the first temperature or a different temperature. The fourth temperature may be the same temperature as the second temperature or a different temperature.

EMBODIMENTS

Next, embodiments of the present processing method will be described. The present disclosure is not limited at all by the following examples.

Embodiment 1

In Embodiment 1, the present processing method was applied using the plasma processing apparatus 1, and a substrate having the same structure as the substrate W illustrated in FIG. 3 was etched. A polysilicon film was used as the mask film MF. The etching conditions for the silicon nitride film $EF_1$ and the silicon oxide film $EF_2$ in Embodiment 1 are as follows. The first processing gas included 80% by, volume or more of HF gas, and the second processing gas included 85% by volume or more of gas.

Etching conditions for the silicon nitride film $EF_1$ (step ST32):
Temperature of substrate support: −70° C.
Pressure of chamber: 23 mT
First processing gas: HF gas, $C_4H_2F_6$ gas, $O_2$ gas
Etching conditions for the silicon oxide film $EF_2$ (step ST34):
Temperature of substrate support: −70° C.
Pressure of chamber: 15 mT
Second processing gas: HF gas, $C_4F_8$ gas, $C_4F_6$ gas, $O_2$ gas Reference Example 1

In Reference Example 1, the same substrate as in Embodiment 1 was etched using the plasma processing apparatus 1. The etching conditions for the silicon nitride film $EF_1$ and the silicon oxide film $FE_2$ in Reference Example 1 are as follows.

Etching conditions for the silicon nitride film $EF_1$:
Temperature of substrate support: 50° C.
Pressure of chamber: 10 mT
First processing gas: $C_4F_8$ gas, $C_4F_6$ gas, $NF_3$ gas, $CH_2F_2$ gas, $O_2$ gas
Etching conditions for the silicon nitride film $EF_2$:
Temperature of substrate support: 70° C.
Pressure of chamber: 10 mT
Second processing gas: $C_4F_8$ gas, $C_4F_6$ gas, $NF_3$ gas, $O_2$ gas The etching target film EF of Embodiment 1 had an etching rate of 546 nm/min and a selection ratio to the mask film MF of 6.1. The etching rate of the etching target film EF of Reference Example 1 was 130 nm/min, and the selection ratio to the mask film MF was 4.7. That is, in Embodiment 1, the etching rate was about four times that of Reference Example 1, which was a significant improvement. Further, in Embodiment 1, the selection ratio was improved by about 1.3 times as compared with Reference Example 1.

Embodiments 2 to 4

In Embodiments 2 to 4, the present processing method was applied using the plasma processing apparatus 1, and the same substrate as in Embodiment 1 was etched. The etching conditions for the silicon nitride film $EF_1$ and the silicon oxide film $EF_2$ in Embodiment 2 are as follows. The first processing gas and the second processing gas were the same and both included 80% by volume or more of HF gas.

Etching conditions for the silicon nitride film $DT_I$ (step ST32):
Temperature of substrate support: −70° C.
Pressure of chamber: 23 Mt
First processing gas: HF gas. $C_4F_8$ gas, $C_4F_6$ gas, $O_2$ gas
Etching conditions for the silicon oxide film $EF_2$ (step ST34):
Temperature of substrate support: −70° C.

Pressure of chamber: 23 Mt
Second processing gas: HF gas, $C_4F_8$ gas, $C_4F_6$ gas, $O_2$ gas In Embodiment 3, etching was performed under the same conditions as in Example 2, except that the first processing gas and the second processing gas included 1.6% by volume of the phosphorus-containing gas. In Embodiment 4, etching was performed under the same conditions as in Example 2, except that the first processing gas and the second processing gas included 3.2% by volume of the phosphorus-containing gas. In Embodiments 3 and 4, $PF_3$ gas was used as the phosphorus-containing gas.

The etching target film EF of Embodiment 2 had an etching rate of 372 nm/min and a selection ratio to the mask film MF of 3.0. The etching target film EF of Embodiment 3 had an etching rate of 471 nm,/min and a selection ratio to the mask film MF of 3.4. The etching target film EF of Embodiment 4 had an etching rate of 530 nm/min and a selection ratio to the mask film MF of 3.2. That is, in Embodiments 3 and 4 in which the phosphorus-containing gas was used as the first processing gas and the second processing gas, the etching rate and selection ratio were further improved compared to Embodiment 2 in which the phosphorus-containing gas was not included.

Embodiments 5 to 7

In Embodiments 5 to 7, the present processing method was applied using the plasma processing apparatus 1, and the same substrate as in Embodiment 1 was etched. The etching conditions for the silicon nitride film $EF_1$ and the silicon oxide film $EE_2$ in Embodiment 5 are as follows. The first processing gas and the second processing gas contained 85% by volume or more of HF gas.

Etching conditions for the silicon nitride film $EE_1$ (step ST32):
Temperature of substrate support: −70° C.
Pressure of chamber: 15 Mt
First processing gas: HF gas, $C_4F_8$ gas. $O_2$ gas
Etching conditions for the silicon oxide film $EF_2$ (step ST34):
Temperature of substrate support: −70° C.
Pressure of chamber: 15 mT
Second processing gas: HF gas, $C_4F_8$ gas, $O_2$ gas In Embodiment 6, etching was performed under the same conditions as in Embodiment 2, except that 1 sccm of $WF_6$ gas was further included as the second processing gas. In Embodiment 7, etching was performed under the same conditions as in Embodiment 6, except that the flow rate of the $WF_6$ gas was three times that of Embodiment 6 (3 sccm).

Figure 6:
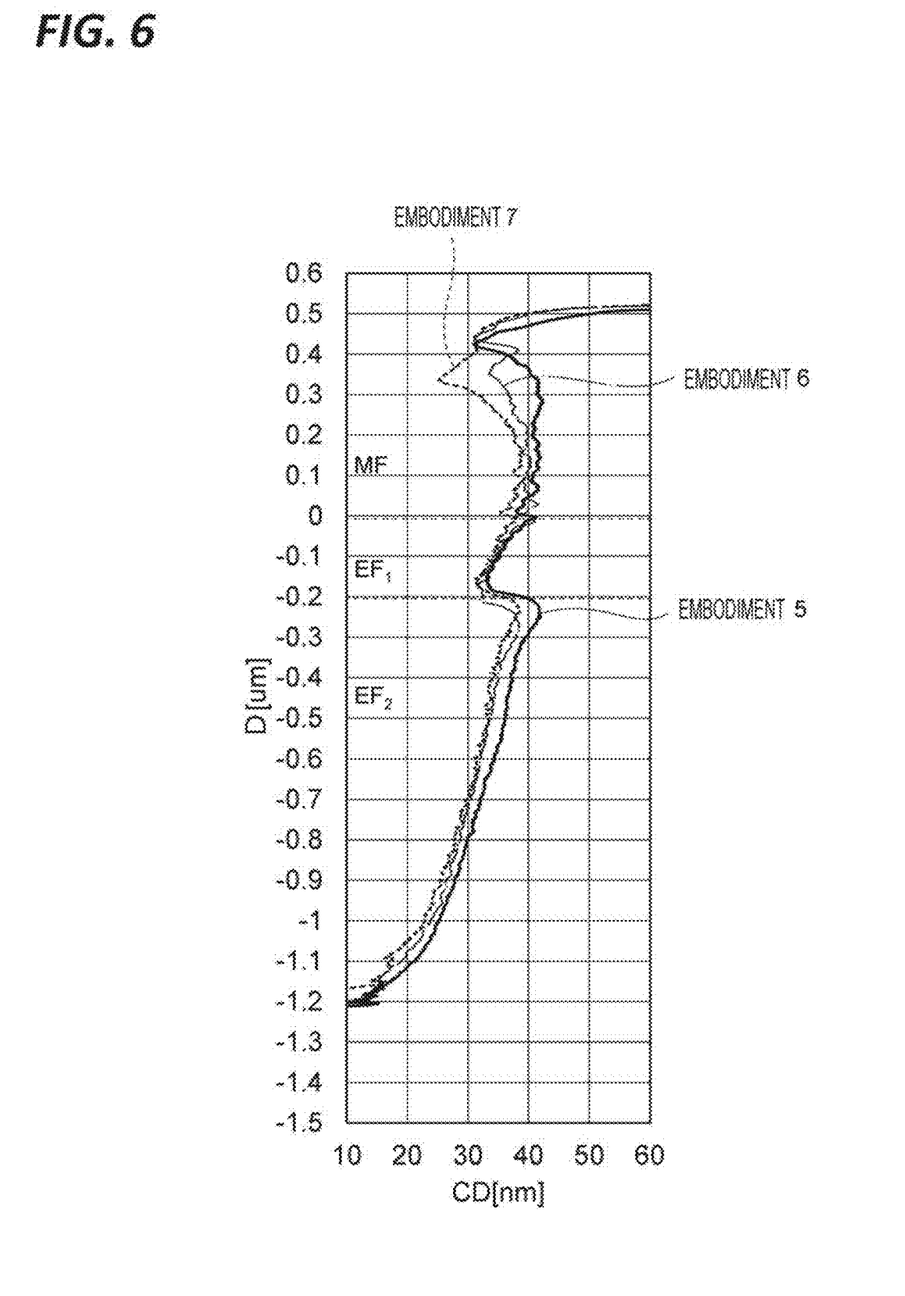
FIG. 6 is a view illustrating etching results according to Embodiments 5 to 7.

FIG. 6 is a view illustrating etching results according to Embodiments 5 to 7. In FIG. 6, the vertical axis represents the depth D μm of the recesses formed in the opening OP of the mask film MF and the etching target film EF. The vicinity of 0 μm on the vertical axis is a boundary between the mask film MF and the silicon nitride film $EF_1$. The vicinity of −0.2 μm on the vertical axis is a boundary between the silicon nitride film $EF_1$ and the silicon oxide film $EF_2$. In FIG. 6, the vertical axis represents the depth CD μm of the recesses formed in the opening OP of the mask film MF and the etching target film EF. As illustrated in FIG. 6, in Embodiments 6 and 7 in which $WF_6$ gas was further included as the second processing gas, the bowing CD (maximum opening width) of the mask film MF and the silicon oxide film $EF_2$ was smaller than in Embodiment 5 in which $WF_6$ gas was not included, and the bowing was not suppressed. The bowing CD of the silicon oxide film $EF_2$ was the same in Embodiment 6 ($WF_6$ gas: 1 sccm) and Embodiment 7 ($WF_6$ gas: 3 sccm). That is, the effect of suppressing bowing of the silicon oxide film $EF_2$ was also obtained by adding a minute amount of $WF_6$ gas of about 1 sccm.

Embodiments 8 and 9

In Embodiments 8 and 9, the present processing method was applied using the plasma processing apparatus 1, and the same substrate as in Embodiment 1 was etched. In Embodiments 8 and 9, 50% over-etching was performed in step ST34. That is, in step ST34, the silicon oxide film $EF_2$ is etched until the underlying film UF is exposed, and furthermore, the underlying film UF is etched in the depth direction for half the time needed for etching the silicon oxide film $EF_2$.

The etching conditions for the silicon nitride film $EF_1$ and the silicon oxide film $EF_2$ in Embodiment 8 are as follows. The first processing gas and the second processing gas included 85% by volume or more of HF gas.

Etching conditions for the silicon nitride film $EF_1$ (step ST32):
Temperature of substrate support: −70° C.
Pressure of chamber: 15 mT
First processing gas: HF gas, $C_4F_8$ gas, $O_2$ gas
Etching conditions for the silicon oxide film $EF_2$ (step ST34):
Temperature of substrate support: −70° C.
Pressure of chamber: 15 mT
Second processing gas: HF gas, $C_4F_8$ gas, $C_4F_6$ gas, $O_2$ gas In Embodiment 9, etching was performed under the same conditions as in Embodiment 8, except that 2 sccm of $WF_6$ gas was further included as the second processing gas.

Figure 7:
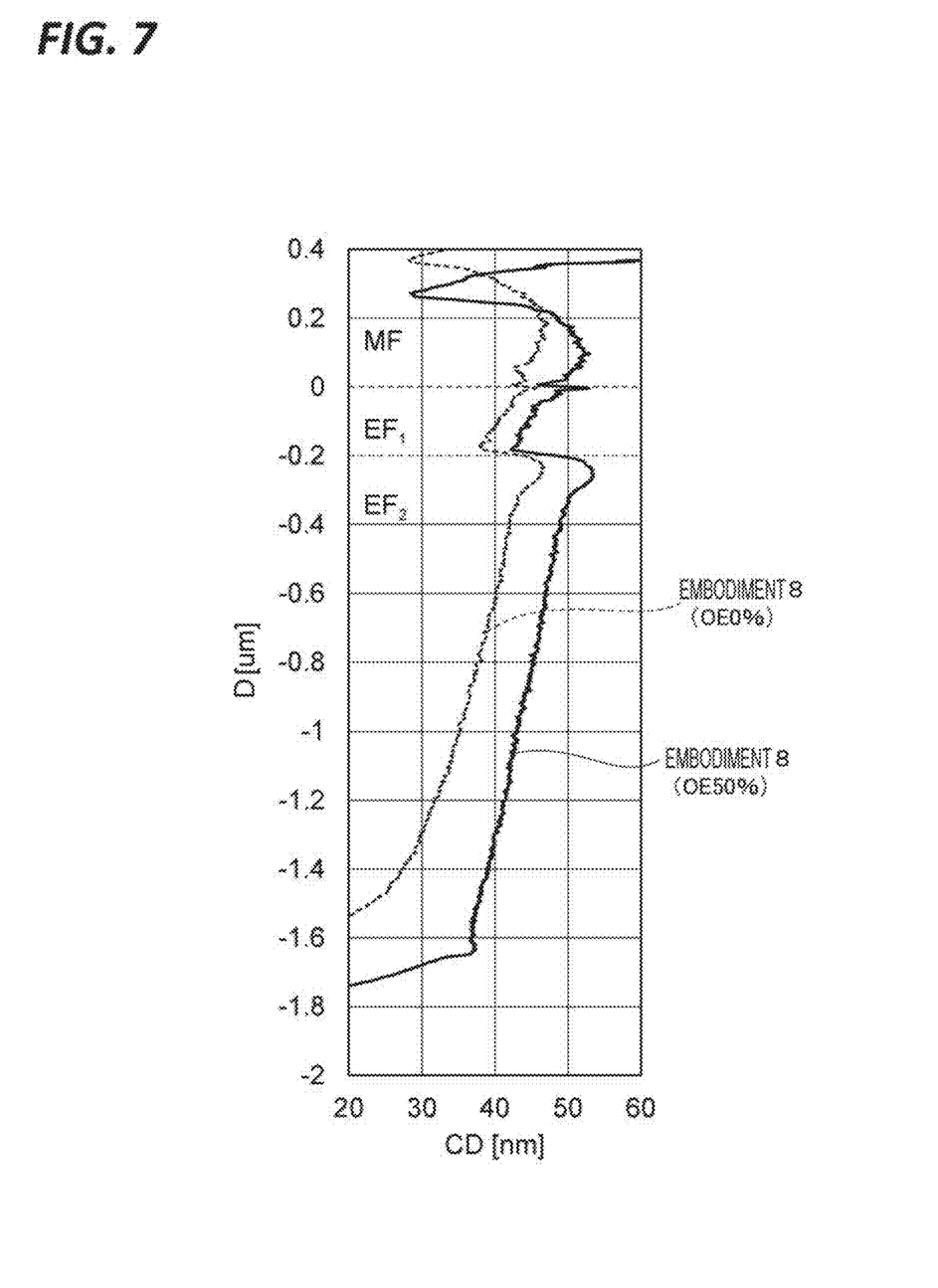
FIG. 7 is a view illustrating etching results according to Embodiment 8.
Figure 8:
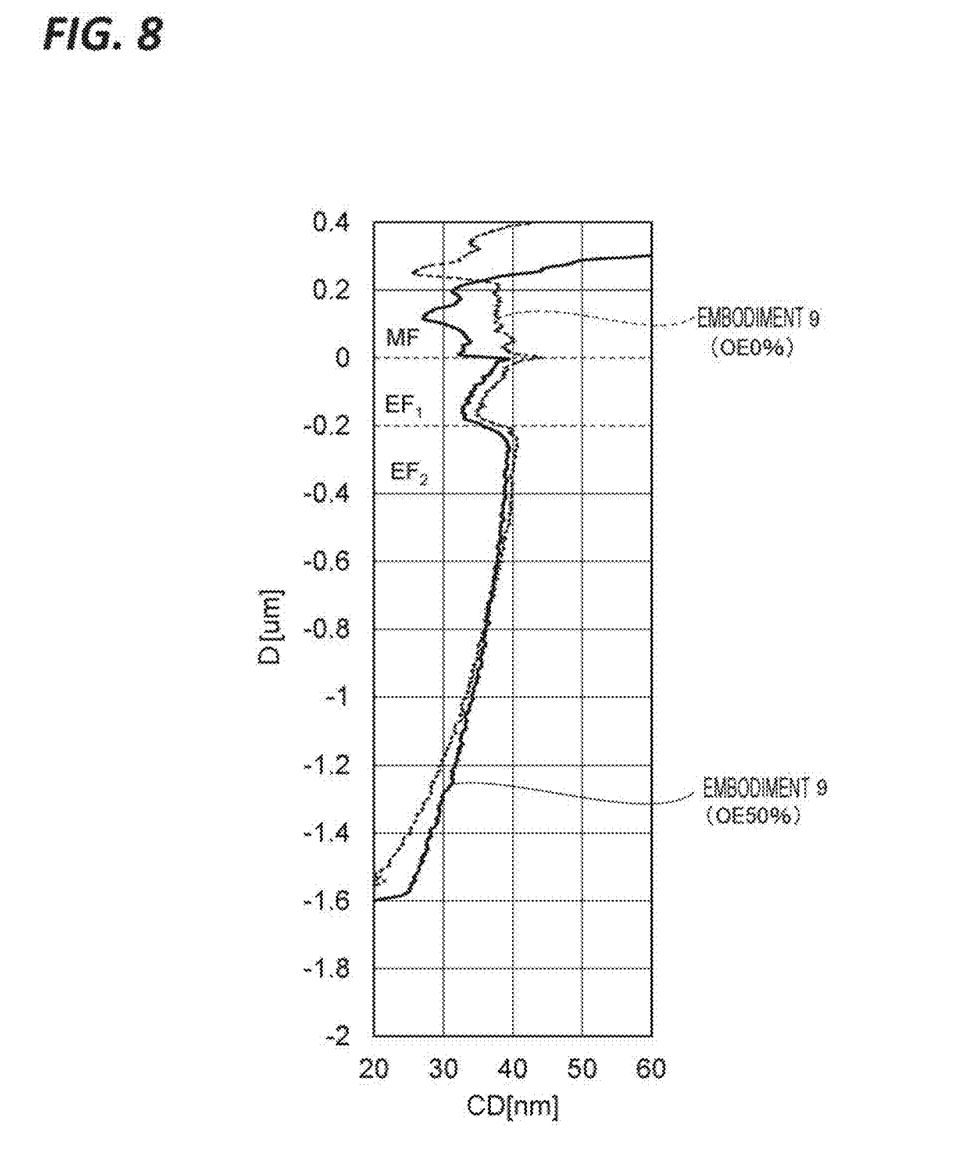
FIG. 8 is a view illustrating etching results according to Embodiment 9.

FIG. 7 is a view illustrating etching results according to Embodiment 8. In FIG. 7, "Embodiment 8 (OE 0%)" is the result before over-etching in step ST34. "Embodiment 8 (OE 50%)" is the result after over-etching in step ST34. FIG. 8 is a view illustrating etching results according to Embodiment 9. In FIG. 8, "Embodiment 9 (OE 0%)" is the result before over-etching in step ST34. "Embodiment 9 (OE 50%)" is the result after over-etching in step ST34. In FIGS. 7 and 8, the vertical axis represents the depth D pm of the recesses formed in the opening OP of the mask film MF and the etching target film EF. The vicinity of 0 μm on the vertical axis is a boundary between the mask film MF and the silicon nitride film $EF_1$. The vicinity of −0.2 μm on the vertical axis is a boundary between the silicon nitride film $EF_1$ and the silicon oxide film $EF_2$. In FIGS. 7 and 8, the vertical axis represents the depth CD pm of the recesses formed in the opening OP of the mask film MF and the etching target film EF.

As illustrated in FIG. 8, in Embodiment 8, the bowing CD of the mask film MF and the silicon oxide film $EF_2$ was enlarged due to over-etching in step ST34. In Embodiment 9 in which $WF_6$ gas was included as the second processing gas, there was almost no change in the bowing CD of the mask film MF and the silicon oxide film $EF_2$ before and after over-etching in step ST34. That is, Embodiment 9 in which the $WF_6$ gas was included was able to suppress the expansion of bowing due to over-etching.

Various modifications may be made to the present processing method without departing from the scope and spirit of the present disclosure. For example, the present processing method may be performed using a plasma processing apparatus that uses an arbitrary plasma source, such as inductively coupled plasma or microwave plasma, other than a capacitively coupled plasma processing apparatus 1.

According to an embodiment of the present disclosure, it is possible to improve an etching rate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing method comprising:
   (a) providing a substrate having an etching target film including a silicon oxide film and a silicon nitride film, and a mask film defining an opening over the etching target film, on a substrate support in a chamber of a plasma processing apparatus;
   (b) generating a first plasma from a first processing gas including HF gas, $C_xF_y$ gas (x and y are integers of 1 or more) or $C_sH_tF_u$ gas (s, t, and u are integers of 1 or more), and an oxygen-containing gas to etch the silicon nitride film; and
   (c) generating a second plasma from a second processing gas including HF gas, $C_vF_w$ gas (v and w are integers of 1 or more), and an oxygen-containing gas to etch the silicon oxide film,
   wherein in (b) and (c), a temperature of the substrate support is set to 0° C. or lower, and
   wherein the first processing gas is different from the second processing gas.

2. The plasma processing method according to claim 1, wherein the first processing gas includes the $C_sH_tF_u$ gas.

3. The plasma processing method according to claim 1, wherein the first processing gas includes the $C_xF_y$ gas, and the $C_xF_y$ gas is different from the $C_vF_w$ gas included in the second processing gas.

4. A plasma processing method, comprising:
   (a) providing a substrate having an etching target film including a silicon oxide film and a silicon nitride film, and a mask film defining an opening over the etching target film, on a substrate support in a chamber of a plasma processing apparatus;
   (b) generating a first plasma from a first processing gas including HF gas, $C_xF_y$ gas (x and y are integers of 1 or more) or $C_sH_tF_u$ gas (s, t, and u are integers of 1 or more), and an oxygen-containing gas to etch the silicon nitride film; and
   (c) generating a second plasma from a second processing gas including HF gas, $C_vF_w$ gas (v and w are integers of 1 or more), and an oxygen-containing gas to etch the silicon oxide film,
   wherein in (b) and (c), a temperature of the substrate support is set to 0° C. or lower, and
   wherein in (b), the temperature of the substrate support is set to a first temperature, and in (c), the temperature of the substrate support is set to a second temperature lower than the first temperature.

5. The plasma processing method according to claim 4, wherein in (b), a bias signal having a first output is supplied to the substrate support, and in (c), a bias signal having a second output smaller than the first output is supplied to the substrate support, or no bias signal is supplied to the substrate support.

6. The plasma processing method according to claim 4, wherein in (b), a pulse wave of a bias signal having a first duty ratio is supplied to the substrate support, and in (c), a pulse wave of a bias signal having a second duty ratio smaller than the first duty ratio is supplied to the substrate support.

7. The plasma processing method according to claim 5, wherein the bias signal is a bias DC signal.

8. The plasma processing method according to claim 4, wherein in (b), a bias RF signal having a first frequency is supplied to the substrate support, and in (c), a bias RF signal having a second frequency lower than the first frequency is supplied to the substrate support.

9. The plasma processing method according to claim 4, wherein in (b), a first heat transfer gas having a first pressure is supplied between the substrate and the substrate support, and in (c), a second heat transfer gas having a second pressure lower than the first pressure is supplied between the substrate and the substrate support.

10. The plasma processing method according to claim 4, wherein in (b), a temperature of a heat transfer fluid supplied to the substrate support is set to a third temperature, and in (c), the temperature of the heat transfer fluid supplied to the substrate support is set to a fourth temperature lower than the third temperature.

11. The plasma processing method according to claim 1, wherein the mask film is a polysilicon film, a boron-doped silicon film, a tungsten-containing film, an amorphous carbon film, a tin oxide film, or a titanium-containing film.

12. The plasma processing method according to claim 1, wherein the mask film has an opening width of 50 nm or less.

13. The plasma processing method according to claim 1, wherein the $C_xF_y$ gas or the $C_vF_w$ gas includes at least one selected from the group consisting of $C_2F_2$ gas, $C_2F_4$ gas, $C_3F_6$ gas, $C_3F_8$ gas, $C_4F_6$ gas, $C_4F_8$ gas, and $C_5F_8$ gas.

14. The plasma processing method according to claim 1, wherein the $C_sH_tF_u$ gas includes at least one selected from the group consisting of $CHF_3$ gas, $CH_2F_2$ gas, $CH_3F$ gas, $C_2HF_5$ gas, $C_2H_2F_4$ gas, $C_2H_3F_3$ gas, $C_2H_4F_2$ gas, $C_3HF_7$ gas, $C_3H_2F_2$ gas, $C_3H_2F_4$ gas, $C_3H_2F_6$ gas, $C_3H_3F_5$ gas, $C_4H_2F_6$ gas, $C_4H_5F_5$ gas, $C_4H_2F_8$ gas, $C_5H_2F_6$ gas, $C_5H_2F_{10}$ gas, and $C_5H_3F_7$ gas.

15. The plasma processing method according to claim 1, wherein a flow rate of the HF gas in the first processing gas is higher than a flow rate of the $C_xF_y$ gas or the $C_sH_tF_u$ gas in the first processing gas and higher than a flow rate of the oxygen-containing gas in the first processing gas, and
   a flow rate of the HF gas in the second processing gas is higher than a flow rate of the $C_vF_w$ gas in the second processing gas and higher than a flow rate of the oxygen-containing gas in the second processing gas.

16. The plasma processing method according to claim 1, wherein at least one of the first processing gas and the second processing gas further includes a phosphorous-containing gas.

17. The plasma processing method according to claim 1, wherein at least one of the first processing gas and the second processing gas further includes $WF_6$ gas.

18. The plasma processing method according to claim 1, wherein in (b) and (c), the temperature of the substrate support is set to −50° C. or lower.

19. A plasma processing method comprising:
   (a) providing a substrate having an etching target film including a silicon oxide film and a silicon nitride film, and a mask film defining an opening over the etching target film, on a substrate support in a chamber of a plasma processing apparatus;

(b) generating a first plasma from a first processing gas to etch the silicon nitride film with HF species, $C_xF_y$ species (x and y are integers of 1 or more) or $C_sH_tF_u$ species (s, t, and u are integers of 1 or more), and oxygen active species included in the first plasma; and (c) generating a second plasma from a second processing gas to etch the silicon oxide film with HF species, $C_vF_w$ species (v and w are integers of 1 or more), and oxygen active species included in the second plasma, wherein in (b) and (c), a temperature of the substrate support is set to 0° C. or lower, and wherein the first processing gas is different from the second processing gas.

20. The plasma processing method according to claim 19, wherein the HF species is generated from at least one selected from the group consisting of $CH_2F_2$ gas, $C_3H_2F_4$ gas, and $C_4H_2F_6$ gas.

21. A plasma processing method comprising:

(a) providing a substrate having an etching target film including a silicon oxide film and a silicon nitride film, and a mask film defining an opening over the etching target film, on a substrate support in a chamber of a plasma processing apparatus;

(b) generating a first plasma from a first processing gas to etch the silicon nitride film with HF species, $C_xF_y$ species (x and y are integers of 1 or more) or $C_sH_tF_u$ species (s, t, and u are integers of 1 or more), and oxygen active species included in the first plasma; and (c) generating a second plasma from a second processing gas to etch the silicon oxide film with HF species, $C_vF_w$ species (v and w are integers of 1 or more), and oxygen active species included in the second plasma, wherein in (b) and (c), a temperature of the substrate support is set to 0° C. or lower, and wherein in (b), the temperature of the substrate support is set to a first temperature, and in (c), the temperature of the substrate support is set to a second temperature lower than the first temperature.

* * * * *